US006353259B1

United States Patent
Sato et al.

(10) Patent No.: US 6,353,259 B1
(45) Date of Patent: Mar. 5, 2002

(54) PROCESS FOR PRODUCING BGA TYPE SEMICONDUCTOR DEVICE, TAB TAPE FOR BGA TYPE SEMICONDUCTOR DEVICE, AND BGA TYPE SEMICONDUCTOR DEVICE

(75) Inventors: Takumi Sato; Norio Okabe; Yasuharu Kameyama; Masahiko Saito, all of Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/338,927

(22) Filed: Jun. 23, 1999

(30) Foreign Application Priority Data

Jun. 25, 1998 (JP) .......................................... 10-179304
Apr. 28, 1999 (JP) .......................................... 11-121989

(51) Int. Cl.⁷ ............................................. H01L 23/48
(52) U.S. Cl. ........................ 257/738; 257/737; 257/780
(58) Field of Search ................................ 438/111, 112, 438/123, 124, 125, 126; 257/723, 724, 737, 738, 780, 781

(56) References Cited

U.S. PATENT DOCUMENTS 5,661,086 A * 8/1997 Nakashima et al. .......... 438/111

FOREIGN PATENT DOCUMENTS

JP          8-31869      2/1996
JP          8-153819     6/1996

* cited by examiner

Primary Examiner—Kevin M. Picardat
(74) Attorney, Agent, or Firm—Scully, Scott, Murphy & Presser

(57) ABSTRACT

"⊐"-shaped slits and linking portions are previously provided so as to surround a semiconductor chip-mounting region in a TAB tape. A semiconductor chip is applied onto the semiconductor chip-mounting region. The semiconductor chip in its electrode pad is connected by bonding to the TAB tape in its inner lead. The bonded connection is subjected to plastic molding. Solder balls are provided on the backside of the TAB tape in its portion corresponding to the semiconductor chip-mounting portion. Thereafter, the package portion is cut off at the cutting position in the linking portion of the slits. By virtue of the above constitution, highly reliable BGA type semiconductor devices can be produced while reducing the thickness and reducing the size.

4 Claims, 3 Drawing Sheets

US 6,353,259 B1

PROCESS FOR PRODUCING BGA TYPE SEMICONDUCTOR DEVICE, TAB TAPE FOR BGA TYPE SEMICONDUCTOR DEVICE, AND BGA TYPE SEMICONDUCTOR DEVICE

FIELD OF THE INVENTION

The invention relates to a process for producing a BGA (ball grid array) type semiconductor device having a structure comprising a semiconductor chip and solder balls mounted on a TAB (tape automated bonding) tape, a TAB tape for a BGA type semiconductor device, and a BGA type semiconductor device.

BACKGROUND OF THE INVENTION

A BGA type semiconductor device is known as a semiconductor device having such a structure as directly mounted on the surface of a substrate with the aid of solder balls. In this BGA type semiconductor device, electric connection to the substrate can be made on the whole area of the plane portion in the package. Therefore, unlike QFP (quad flat package) and the like wherein connection is made in each side of the package, multiple pin (multiple port) can be advantageously achieved without narrowing lead-to-lead (terminal-to-terminal) pitch. In particular, use of a TAB tape as a structural material for the package can realize a reduction in thickness and a reduction in size (chip size package).

The conventional process for producing a BGA type semiconductor device comprises the steps of: mounting chips on a TAB tape; performing inner lead bonding, resin sealing, and ball mounting in that order; and finally punching out four peripheries of the TAB tape at a time using a die.

The conventional production process of a BGA type semiconductor device will be explained in more detail.

A TAB tape of a resin film has on its both sides sprocket holes at given intervals, and semiconductor chips are mounted at given intervals on the TAB tape in its center portion. The semiconductor chip is mounted with the aid of an elastomer having an adhesive surface. The fixed semiconductor chip in its electrode pad (in this example, two pads in upper and lower hems) is connected by bonding to an inner lead provided so as to project from the TAB tape. In order to protect the inner lead, plastic molding is carried out using a resin sealant. A plurality of solder balls are two-dimensionally and regularly mounted on a wiring pattern provided on the TAB tape in its side opposite to the semiconductor chip-mounted side. Finally, cutting from the TAB tape is made semiconductor chip by semiconductor chip.

The construction of a semiconductor chip-mounting portion will be explained in more detail. A belt-shaped opening through which an inner lead is to be passed is provided in the TAB tape. After bonding, the opening is subjected to plastic molding with a resin sealant.

The procedure for producing a BGA type semiconductor device will be explained. At the outset, semiconductor chips are applied through an elastomer onto one side of the TAB tape. Next, the semiconductor chip in its electrode pad is connected by bonding to an inner lead on the TAB tape side, and plastic molding is then carried out using a resin sealant to protect the bonded portion. Solder balls are mounted on a wiring pattern at its predetermined positions. Thereafter, four sides of the TAB tape at its cutting position are simultaneously cut using a die to obtain one package.

Another conventional BGA type semiconductor device is described, for example, in Japanese Patent Laid-Open Nos. 31869/1996 and 153819/1996. In the BGA semiconductor device described in the former publication, device holes are provided in a TAB tape. A plurality of electrode pads for electrode bumps (solder balls) connected to an inner lead are interspersed around the device holes. Elongate cut holes are provided on four sides around the pad region. After the formation of the electrode bumps and before mounting onto a mount substrate, cutting is performed in the cut hole portions to separate semiconductor devices from each other or one another. On the other hand, in the BGA type semiconductor device in the latter publication, a semiconductor chip is mounted on a mount substrate so that the electrode-forming surface of the semiconductor chip faces upward. The wiring pattern on the upper surface of the substrate is connected thereto by wire bonding. A part of upper and lower wiring patterns in the substrate are connected to each other with the aid of through-holes. Solder balls are mounted on the lower wiring pattern. As with the semiconductor device disclosed in Japanese Patent Laid-Open No. 31869/1996, the elongate holes provided on the outermost periphery are used as sites for cutting out and separating semiconductor devices from each other or one another before mounting onto the mount substrate.

In the conventional processes for producing a BGA type semiconductor device, the whole periphery of the package is simultaneously punched out at the time of the separation of semiconductor devices from each other or one another. Therefore, stress is likely to be applied to the adhesion interface of the TAB tape and the resin sealant or the semiconductor chip and a joint between the semiconductor chip in its electrode pad and the lead, leading to separation of the joint and cracking of the sealing resin. This often lowers the reliability of the package.

Since the TAB tape is continuously present on the outer periphery of the semiconductor chip, plastic molding using a liquid resin causes a variation in wetting and spreading of the resin in this portion. This results in uneven thickness of the finally formed sealing resin layer. Specifically, excessive wetting and spreading of the liquid resin cause an excessively small resin layer thickness. Likewise, when the resin is wetted and spread to the cutting position of the TAB tape (outward line of the package), the final cutting step creates cutting of the resin together with the TAB tape. This also leads to the breaking of the joint, that is, the separation between the electrode pad and the lead, and the cracking of the sealing resin, often resulting in lowered reliability of the package.

In the BGA semiconductor devices disclosed in Japanese Patent Laid-Open Nos. 31869/1996 and 153819/1996, the adhesion interface and the joint are located inside each of the solder ball. Specifically, the solder balls are provided so as to surround the semiconductor chip. According to this construction, a problem of the breaking of the joint, that is, the separation between the semiconductor chip in its electrode pad and the lead, and the cracking of the sealing resin attributable to the application of stress can be avoided.

SUMMARY OF THE INVENTION

Accordingly, it is an object of the invention to provide a process for producing a BGA type semiconductor device, a TAB tape for a BGA type semiconductor device, and a BGA type semiconductor device that can offer high reliability while reducing the thickness and the size of the package.

According to the first feature of the invention, a process for producing a BGA (ball grid array) type semiconductor device, comprises the steps of: forming openings around each chip-mounting region in a TAB (tape automated bonding) tape while leaving linking portions for connecting the chip-mounting regions to the other region; mounting a semiconductor chip on each of the chip-mounting regions in the TAB tape; connecting, by bonding, the semiconductor chips each in its electrode pad to the TAB tape in its wiring pattern; subjecting the bonded connection between the semiconductor chip and the electrode pad to plastic molding with a resin; providing solder balls on the backside of the TAB tape in its portions corresponding to the chip-mounting portions; and cutting off the linking portions to provide discrete semiconductor devices.

According to the second feature of the invention, a TAB tape for a BGA type semiconductor device comprises a large number of solder ball-mounting holes provided in chip-mounting regions, wherein an opening is provided around the chip-mounting region while leaving a linking portion for linking the chip-mounting region to the other region.

According to a third feature of the invention, a BGA type semiconductor device is produced by a process comprising the steps of: providing a TAB tape for a BGA type semiconductor device, comprising a large number of solder ball-mounting holes provided in chip-mounting regions, an opening being provided around the chip-mounting region while leaving a linking portion for linking the chip-mounting region to the other region; mounting a semiconductor chip on each of the chip-mounting regions in the TAB tape; connecting, by bonding, the semiconductor chips each in its electrode pad to the TAB tape in its wiring pattern; subjecting the connection between the semiconductor chip and the electrode pad to plastic molding with a resin; mounting solder balls on the solder ball-mounting holes in the TAB tape; and cutting off the linking portions to provide discrete semiconductor devices.

BRIEF DESCRIPTION OF THE DRAWING

The invention will be explained in more detail in conjunction with the appended drawings, wherein.

DESCRIPTION OF THE PREFERRED EMBODIMENTS

Before describing the preferred embodiments of the invention, the conventional process for producing a BGA type semiconductor device will be explained in FIGS. 1 to 3.

Figure 1:
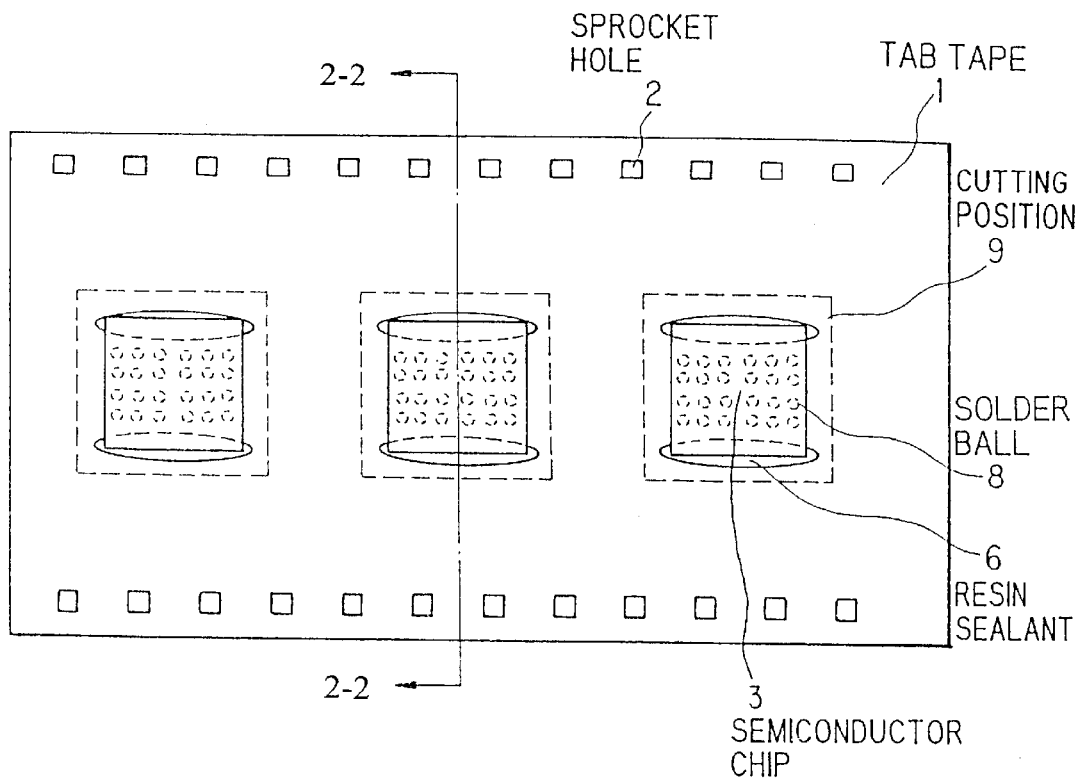
FIG. 1 is a plan view showing a semiconductor device produced by a conventional process for producing a BGA type semiconductor device.
Figure 2:
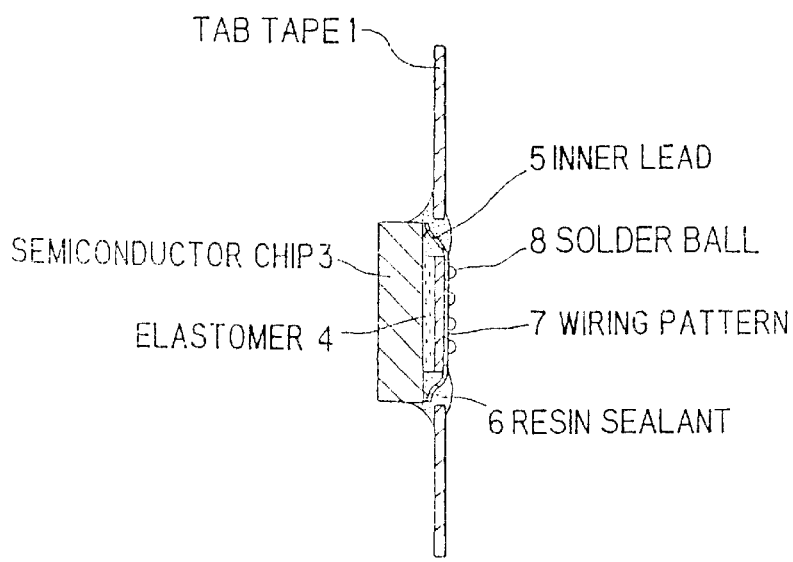
FIG. 2 is a cross-sectional view taken on line 2—2 of FIG. 1.

FIG. 1 is a plan view showing a semiconductor device produced by a conventional process for producing a BGA type semiconductor device, and FIG. 2 a cross-sectional view taken on line 2—2 of FIG. 1. FIGS. 1 and 2 show a state before cutting out the package.

A TAB tape 1 of a resin film has on its both sides sprocket holes 2 at given intervals, and semiconductor chips 3 are mounted at given intervals on the TAB tape 1 in its center portion. The semiconductor chip 3 is mounted with the aid of an elastomer 4 having an adhesive surface. The fixed semiconductor chip 3 in its electrode pad 3a (in this example, two pads in upper and lower hems) is connected by bonding to an inner lead 5 provided so as to project from the TAB tape 1. In order to protect the inner lead 5, plastic molding is carried out using a resin sealant 6. A plurality of solder balls 8 are two-dimensionally and regularly mounted on a wiring pattern 7 provided on the TAB tape 1 in its side opposite to the semiconductor chip 3 mounted side. Finally, cutting from the TAB tape 1 is made semiconductor chip 3 by semiconductor chip 3. Numeral 9 designates the cutting position (indicated by a dotted line).

Figure 3:
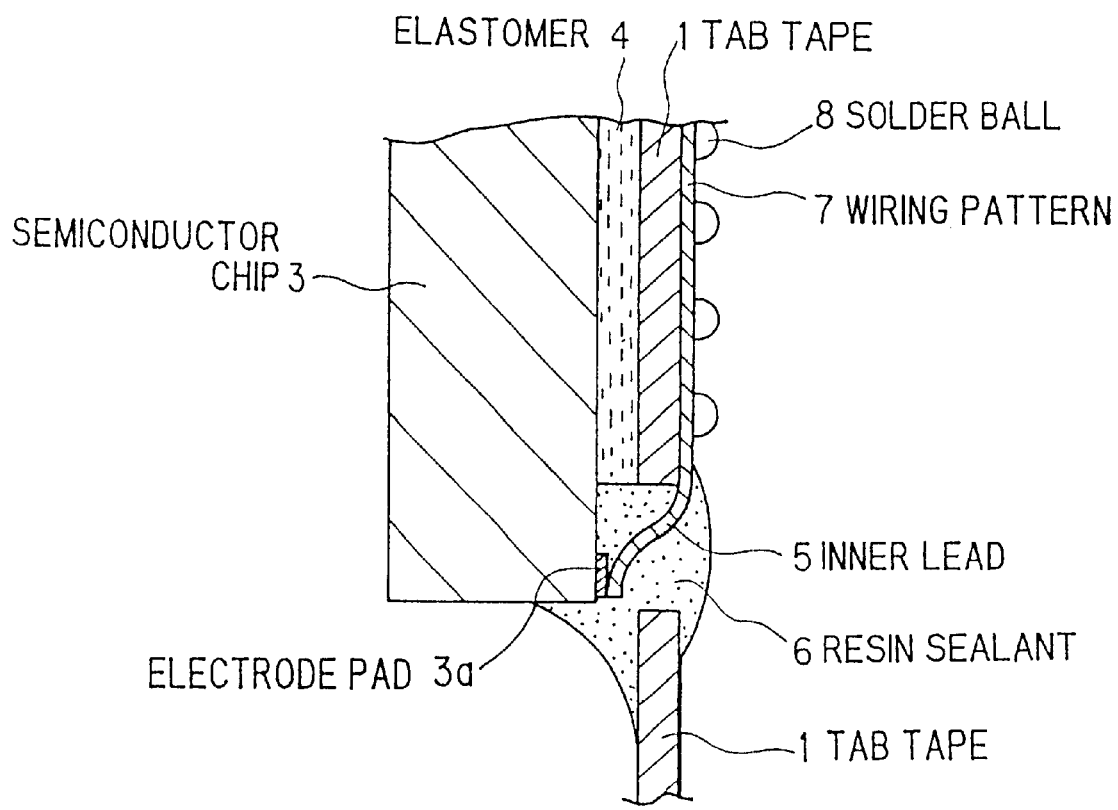
FIG. 3 is a cross-sectional view showing the detailed construction of a semiconductor chip-mounting region in the BGA type semiconductor device of FIG. 1.

FIG. 3 shows the detailed construction of the semiconductor chip 3 mounting portion. A belt-shaped opening through which an inner lead 5 is to be passed is provided in the TAB tape 1. After bonding, the opening is subjected to plastic molding with a resin sealant 6.

The procedure for producing a BGA type semiconductor device shown in FIGS. 1 to 3 will be explained. At the outset, semiconductor chips 3 are applied through an elastomer 4 onto one side of the TAB tape 1. Next, as shown in FIG. 3, the semiconductor chip in its electrode pad 3a is connected by bonding to an inner lead 5 on the TAB tape 1 side, and plastic molding is then carried out using a resin sealant 6 to protect the bonded portion. As shown in FIG. 1, solder balls 8 are then mounted on a wiring pattern 7 at its predetermined positions. Thereafter, four sides of the TAB tape 1 at its cutting position 9 are simultaneously cut using a die to obtain one package.

In the conventional processes for producing BGA type semiconductor device, however, the whole periphery of the package is simultaneously punched out at the time of the separation of semiconductor devices from each other. Therefore, stress is likely to be applied to the adhesion interface of the TAB tape and the resin sealant or the semiconductor chip and a joint between the semiconductor chip in its electrode pad and the lead, leading to breaking of the joint, that is, separation between the electrode pad and the lead, and cracking of the sealing resin. This often lowers the reliability of the package.

Next, the preferred embodiments of the invention will be explained in FIGS. 4 and 5.

Figure 4:
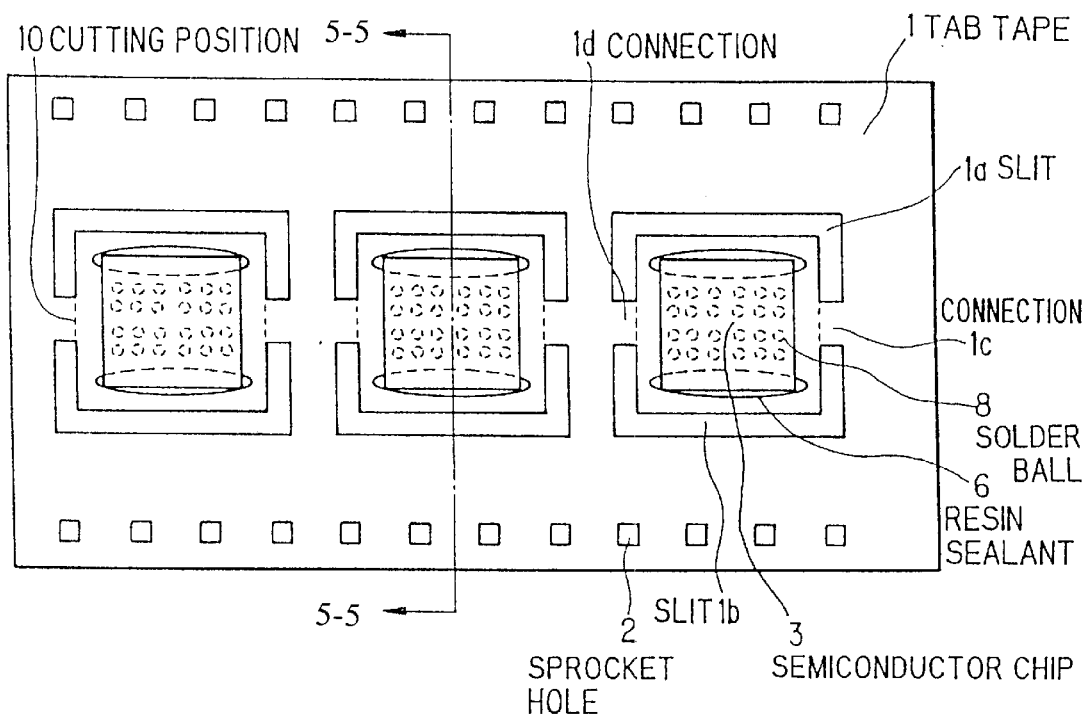
FIG. 4 is a plan view showing a semiconductor device produced by the process for producing a BGA type semiconductor device according to the first preferred embodiment of the invention.

FIG. 4 shows semiconductor devices, before separation from one another, produced by the process for producing a BGA type semiconductor device according to the invention. FIG. 5 shows a diagram taken on line 5—5 of FIG. 4.

A TAB tape 1 of a resin film has on its both sides sprocket holes 2 provided at given intervals. Semiconductor chips 3 are mounted in the center portion of the TAB tape at given intervals.

"⊐"-shaped slits 1a, 1b serving as an opening are provided on upper and lower parts of the semiconductor chip 3 mounted region so as to face each other. The semiconductor chip 3 is mounted with the aid of an elastomer 4 which has an adhesive surface and forms an adhesive layer. The semiconductor chip 3 in its electrode pad (not shown) is connected by bonding to an inner lead 5 provided so as to project from the TAB tape 1. Plastic molding using a liquid resin sealant 6 is carried out to protect the inner lead 5. A wiring pattern 7 is provided on the backside of the TAB 1. A plurality of solder balls 8 are two-dimensionally and regularly arranged on the wiring pattern 7.

As shown in FIG. 4, linking portions 1c, 1d serving as a cutting portion are left between slits 1a, 1b of the TAB tape 1. The linking portions 1c, 1d are provided in places away from the adhesion interface of the TAB tape 1 and the resin sealant 6 or the semiconductor chip 3 and the connection between the electrode pad 3a and the inner lead 5, that is, provided on sides orthogonal to the inner lead connection provided with the resin sealant 6.

The chip-mounting region formed inside the slits 1a, 1b of the TAB tape 1 is a rectangular region having opposed first and third sides and opposed second and fourth sides. The bonding-connected portion and the resin-molded portion are located on the first and third sides. On the other hand, the linking portions 1c, 1d are located on the second and fourth sides.

The details of the semiconductor chip 3 mounted region are as shown in FIG. 3. The semiconductor chip 3 in its electrode pad 3a is bonded to the inner lead 5 conducted to the wiring pattern 7, followed by plastic molding using a liquid resin sealant 6 for protection purposes. The slits 1a, 1b are provided jut outside the resin molded portion using the resin sealant 6. Therefore, when the whole periphery of the package is punched out at a time, the stress applied to the TAB tape 1 is concentrated on a part of the connections around the linking portions 1c, 1d, while reduced stress is applied to the other connections. This markedly reduces damage at the time of assembling. Likewise, since the slits 1a, 1b are provided just outside the molded portion using the resin sealant 6, spreading of the sealing resin is restricted by the slits 1a, 1b. This results in the formation of resin fillets having a given shape. Therefore, the regulation of the sealing resin layer thickness is easy, and, in addition, little or no flow of the resin into the linking portions 1c, 1d as the final cutting portion occurs. No significant load is applied at the time of cutting, so that damage to the package attributable to the stress can be avoided.

Figure 5:
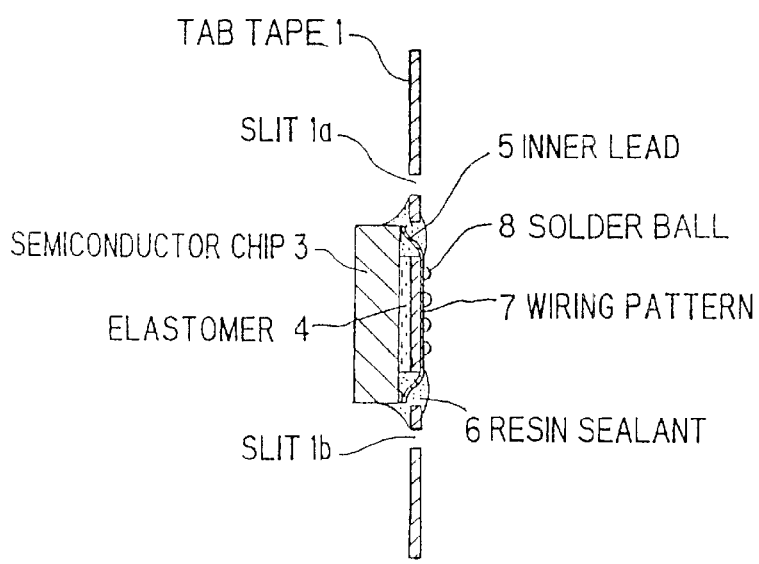
FIG. 5 is a cross-sectional view taken on line 5—5 of FIG. 4.

In the semiconductor device shown in FIGS. 4 and 5, the semiconductor chip 3 is connected to the electrode pad 3a through the inner lead 5 projected from the wiring pattern 7. Wire bonding may be used instead of this connecting method.

Next, the process for producing a BGA type semiconductor device according to the preferred embodiment of the invention will be explained.

(1) Slits 1a, 1b are formed while leaving linking portions 1c, 1d around a chip-mounting region of a TAB tape.

(2) A semiconductor chip 3 is applied to the TAB tape, with the aid of an elastomer 4.

(3) Inner lead bonding is carried out to electrically connect the semiconductor chip 3 in its electrode pad 3a to the TAB tape 1 in its wiring pattern 7.

(4) Plastic molding using a liquid resin sealant 6 is carried out for protecting the inner lead bonded portion.

(5) Solder balls 5 are mounted on the wiring pattern 7.

(6) Punching-out is carried out using a die at a package cutting position (a cutting position 10 indicated by a dotted line inside the slits 1a, 1b in FIG. 4) in the TAB tape.

In the production process according to the preferred embodiment of the invention, by virtue of the provision of slits 1a, 1b, the length of the package cutting position is only the length of the linking portions 1c, 1d and hence is much shorter than the cutting length in the prior art technique. Further, since the linking portions 1c, 1d serving as the cutting position are provided on the side different from the resin molded portion using the resin sealant 6. At the time of punching-out, this can reduce stress applied to the joint between the TAB tape 1 in its wiring pattern 7 and the electrode pad 3a, contributing a fear of the resin sealant 6 being punched out.

As is apparent from the foregoing description, according to the invention, openings are previously provided around a semiconductor chip, and, in the final stage, cutting is carried out in the opening portion. This can reduce the cutting length after assembling and can prevent breaking of the bonded portion, that is, separation between the electrode pad and the lead, and cracking of the sealing resin. Therefore, enhanced package assembling yield and enhanced reliability can be realized.

The invention has been described in detail with particular reference to preferred embodiments, but it will be understood that variations and modifications can be effected within the scope of the invention as set forth in the appended claims.

What is claimed is:

1. A TAB tape for a BGA type semiconductor device, comprising:

a number of solder ball-mounting holes provided in a chip mounting region, and a belt shaped opening provided in said chip mounting region, openings provided around said chip-mounting region while leaving a linking portion for linking said chip-mounting region to the other region.

2. The TAB tape according to claim 1, wherein the opening is a slit having at least one linking portion.

3. The TAB tape according to claim 1, wherein the chip-mounting region is a rectangular region having opposed first and third sides and opposed second and fourth sides and the linking portion is located substantially at the center portion of the first to fourth sides.

4. A BGA type semiconductor device produced by a process comprising the steps of: providing a TAB tape for a BGA type semiconductor device, comprising a large number of solder ball-mounting holes provided in chip-mounting regions, an opening being provided around the chip-mounting region while leaving a linking portion for linking the chip-mounting region to the other region; mounting a semiconductor chip on each of the chip-mounting regions in the TAB tape; connecting, by bonding, the semiconductor chips each in its electrode pad to the TAB tape in its wiring pattern; subjecting the connection between the semiconductor chip and the electrode pad to plastic molding with a resin; mounting solder balls on the solder ball-mounting holes in the TAB tape; and cutting off the linking portions to provide discrete semiconductor devices.

\* \* \* \* \*